(12) United States Patent
Bains et al.

(10) Patent No.: US 9,728,245 B2
(45) Date of Patent: Aug. 8, 2017

(54) PRECHARGING AND REFRESHING BANKS IN MEMORY DEVICE WITH BANK GROUP ARCHITECTURE

(71) Applicant: Intel Corporation, Santa Clara, CA (US)

(72) Inventors: Kuljit S Bains, Olympia, WA (US); John B Halbert, Beaverton, OR (US); Nadav Bonen, Ofer (IL); Tomer Levy, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/865,754

(22) Filed: Sep. 25, 2015

(65) Prior Publication Data

US 2016/0254044 A1    Sep. 1, 2016

Related U.S. Application Data

(60) Provisional application No. 62/126,597, filed on Feb. 28, 2015.

(51) Int. Cl.
G11C 7/00       (2006.01)
G11C 11/406     (2006.01)
G11C 11/408     (2006.01)

(52) U.S. Cl.
CPC .... G11C 11/40618 (2013.01); G11C 11/4087 (2013.01); G11C 11/40603 (2013.01); G11C 11/40611 (2013.01)

(58) Field of Classification Search
CPC .................. G11C 11/40618; G11C 11/4087
See application file for complete search history.

(56) References Cited

U.S. PATENT DOCUMENTS

| 2005/0157577 | A1  | 7/2005  | Barth et al. |
| 2005/0243627 | A1  | 11/2005 | Lee et al. |
| 2007/0121409 | A1  | 5/2007  | Remaklus, Jr. et al. |
| 2008/0270683 | A1  | 10/2008 | Barth et al. |
| 2009/0116326 | A1  | 5/2009  | Lee |
| 2012/0026821 | A1* | 2/2012  | Kang .................... G11C 11/406 365/222 |
| 2012/0079183 | A1  | 3/2012  | Bains |
| 2013/0080694 | A1  | 3/2013  | Iyer et al. |
| 2014/0006703 | A1* | 1/2014  | Bains ................ G11C 11/40618 711/106 |
| 2014/0192605 | A1  | 7/2014  | Crawford et al. |

(Continued)

OTHER PUBLICATIONS

International Search Report and Written Opinion for PCT Patent Application No. PCT/US2016/017688, Mailed Feb. 12, 2016, 13 pages.

(Continued)

*Primary Examiner* — Pho M Luu
*Assistant Examiner* — Mohammed A Bashar
(74) *Attorney, Agent, or Firm* — Compass IP Law PC

(57) ABSTRACT

Memory subsystem refresh management enables commands to access one or more identified banks across different bank groups with a single command. Instead of sending commands identifying a bank or banks in separate bank groups by each bank group individually, the command can cause the memory device to access banks in different bank groups. The command can be a refresh command. The command can be a precharge command.

26 Claims, 5 Drawing Sheets

(56) References Cited

U.S. PATENT DOCUMENTS

2014/0344513 A1 11/2014 Lo et al.
2014/0355332 A1 12/2014 Youn et al.
2015/0092508 A1 4/2015 Bains
2015/0194197 A1 7/2015 West et al.
2015/0318035 A1 11/2015 Dong et al.

OTHER PUBLICATIONS

JEDEC Standard, Double Data Rate 4 (DDR4) SDRAM, JESD79-4A, Nov. 2013, JEDEC Solid State Technology Association.

* cited by examiner

COMMAND TABLE 210

| | | CKE | | | | | | | | | | | A17, | | |
| | CMD | CK_t (n-1) | CK_t (n) | CS_n | ACT_n | RAS_n /A16 | CAS_n /A15 | WE_n /A14 | BG0-BG2 | BA0-BA1 | C2-C0 | A12/ BC_n | A13, A11 | A10 /AP | A0-A9 |
|---|---|---|---|---|---|---|---|---|---|---|---|---|---|---|---|
| 212 | REF | H | H | L | H | L | L | H | V | V | V | H | V | V | V |
| 214 | REFpb | H | H | L | H | L | L | H | BG | BA | V | L | V | V | V |
| 216 | PREpb | H | H | L | H | L | H | L | V | BA | V | L | V | L | V |
| 218 | PRE | H | H | L | H | L | H | L | BG | BA | V | H | V | L | V |
| 220 | PREA | H | H | L | H | L | H | L | V | V | V | V | V | H | V |

PRECHARGING AND REFRESHING BANKS IN MEMORY DEVICE WITH BANK GROUP ARCHITECTURE

RELATED APPLICATION

The present application is a non-provisional application based on U.S. Provisional Application No. 62/126,597, filed Feb. 28, 2015. The present application claims the benefit of priority of the provisional application, and the provisional application is hereby incorporated by reference.

FIELD

Embodiments of the invention are generally related to memory subsystems, and more particularly to performing refresh in a memory device with a bank group architecture.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright© 2015, Intel Corporation, All Rights Reserved.

BACKGROUND

Certain memory devices have a bank group architecture. Traditional bank architecture does not scale well with increased size and speed of the memory subsystems. Improvements in technology used to produce newer memories tend to make smaller features available in the memory, which can reduce operating voltages and improve speed. However, as processing technologies improve, the size and complexity of the memories has increased, and thus the core cycle time (tCCD) has not scaled with data I/O (input/output) bandwidth. tCCD refers to a column-to-column commands or command-to-command delay, referring to back-to-back accesses to the same bank. The column command can refer to a column address strobe command (CAS) used to access the memory.

As I/O speeds increase, the core would traditionally need to increase its speed to utilize the full data I/O bandwidth. Thus, doubling the I/O speed would require doubling the core cycle time. However, increasing core cycle times to reduce tCCD is very power and die-size intensive. With bank group architecture, the memory resources can be segmented into groups of banks. The use of bank groups can improve the apparent cycling time of the memory, because access to different bank groups can be handled independently. Thus, instead of needing to cycle twice as fast to fully utilize I/O bandwidth, the memory can access different bank groups in sequence. Memory subsystems can allow for a shorter cycling for access between different bank group, and a longer cycling for access between banks within the same bank group.

While the use of bank groups provides improvements in data bandwidth utilization, it can significantly increase the command bandwidth. The use of bank groups typically increases the number of banks in a system. With more banks, the memory controller needs to increase the number of commands utilized to maintain the memory. In particular, in volatile memory devices, the refresh commands consume a significant amount of operational bandwidth of the memory by accessing banks in different bank groups. Increasing the number of banks has traditionally increased the number of refresh commands needed to be issued by the memory controller.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figures 1, 2:
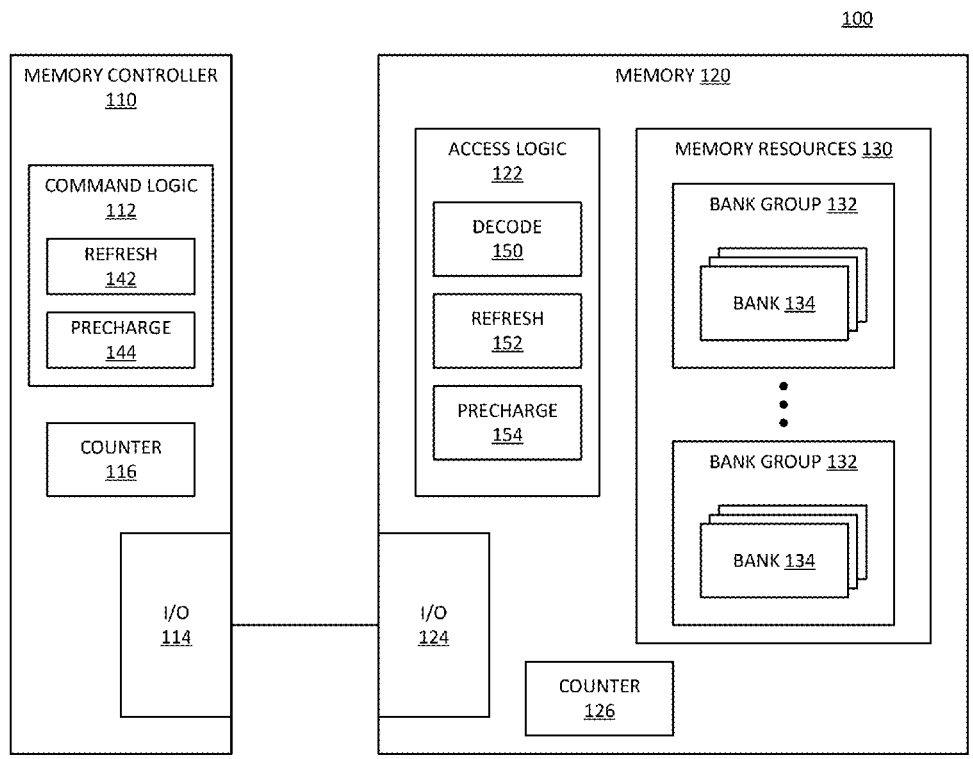
FIG. 1 is a block diagram of an embodiment of a system that implements bank refresh across bank groups.
FIG. 2 is a representation of an embodiment of a command table for per bank and all bank refresh commands and per bank and all bank precharge commands.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, memory subsystem refresh management enables refreshing one or more identified banks across different bank groups with a single refresh command. A similar capability can exist as far as implementing precharge of one or more identified banks across different bank groups with a single precharge command. Instead of sending precharge and/or refresh commands identifying a bank or banks in separate bank groups by each bank group individually, the memory controller can generate a command that causes the memory device to concurrently precharge and/or refresh banks in different bank groups.

Reference to memory devices can apply to different memory types, and in particular, any memory that has a bank group architecture. Memory devices generally refer to volatile memory technologies. Volatile memory is memory whose state (and therefore the data stored on it) is indeterminate if power is interrupted to the device. Nonvolatile memory refers to memory whose state is determinate even if power is interrupted to the device. Dynamic volatile memory requires refreshing the data stored in the device to maintain state. One example of dynamic volatile memory includes DRAM (dynamic random access memory), or some variant such as synchronous DRAM (SDRAM). A memory subsystem as described herein may be compatible with a number of memory technologies, such as DDR4 (DDR version 4, initial specification published in September 2012 by JEDEC), DDR4E (in development by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (currently in discussion by JEDEC), HBM2 (HBM version 2), currently in discussion by JEDEC), and/or others, and technologies based on derivatives or extensions of such specifications.

In addition to, or alternatively to, volatile memory, in one embodiment, reference to memory devices can refer to a nonvolatile memory device whose state is determinate even if power is interrupted to the device, for such devices that have a bank group architecture. In one embodiment, the nonvolatile memory device is a block addressable memory device, such as NAND or NOR technologies. Thus, a memory device can also include a future generation nonvolatile devices, such as a three dimensional crosspoint memory device, or other byte addressable nonvolatile memory device. In one embodiment, the memory device can be or include multi-threshold level NAND flash memory, NOR flash memory, single or multi-level Phase Change Memory (PCM), a resistive memory, nanowire memory, ferroelectric transistor random access memory (FeTRAM), magnetoresistive random access memory (MRAM) memory that incorporates memristor technology, or spin transfer torque (STT)-MRAM, or a combination of any of the above, or other memory.

More specifically, subject matter described herein applies to memory technologies that support and/or are compatible with the use of bank groups. Certain access commands addressed to a specific bank can be executed in the identified bank address across all bank groups.

FIG. 1 is a block diagram of an embodiment of a system that implements bank refresh across bank groups. System 100 is one example of a memory subsystem, with memory controller 110 and memory device 120. Memory device 120 can be or include, for example, a DRAM chip or die. In one embodiment, memory device 120 is or includes an SDRAM chip or die. In one embodiment, memory 120 is a standalone memory device in a system. In one embodiment, memory 120 represents one or more memory devices directly connected to a memory controller and/or a host processor. In one embodiment, memory 120 represents multiple memory device coupled in parallel to a controller and/or host processor, which share one or more buses (such as a command and address bus and at least a portion of a data bus). In one embodiment, memory 120 is one of multiple memory devices that are part of a memory module, such as a dual inline memory module (DIMM).

Memory controller 110 includes command logic 112 to manage sending commands to memory 120. Command logic 112 represents logic that determines what commands to issue, determines when to issue commands, and generates the commands to send to the memory device. In one embodiment, command logic 112 is part of other logic or control logic of memory controller 110. Memory controller 110 includes I/O (input/output) hardware 114 to connect to memory 120. I/O hardware 114 can include pins, connectors, traces, wires, signal lines, and/or other hardware resources to exchange signals between memory controller 110 and memory 120. I/O hardware 114 can include drivers, transceivers, ODT (on-die termination), and/or other logic to send and/or receive signals.

In one embodiment, command logic 112 includes refresh command logic 142 to manage the refresh of volatile memory 120. Refresh logic 142 represents logic that determines when to issue refresh commands, and generates the commands to send to the memory device. In one embodiment, command logic 112 includes precharge command logic 144 to manage the precharging of portions of the memory array or memory resources 130 of memory device 120. In one embodiment, memory controller 110 generates one or more precharge commands in conjunction with one or more refresh commands. Precharge logic 144 can cause memory 120 to place a memory resource in a reset state.

Memory 120 includes memory resources 130, organized as multiple bank groups 132. Thus, memory 120 has a bank group architecture. For example, memory 120 can include 2, 4, or 8 bank groups 132. Each bank group includes multiple banks 134, such as 4 or 8 banks. For example, memory 120 can be a ×4 or ×8 device (referring to data bus interface width) with 4 bank groups having 8 banks each, or a ×4 or ×8 device with 8 bank groups having 4 banks each, or a ×16 device having 4 bank groups with 4 banks each. Such examples are for purposes of illustration, and are not limiting. Each bank includes addressable memory locations (e.g., wordlines or cachelines or pages) that store data. In one specific example, memory 120 is a DDR4 or DDR4E memory having a bank group architecture. As mentioned above, traditional bank architecture has not scaled due to core cycle time (tCCD). However, certain DDR4 architectures can have 2 or 4 bank groups, with up to eight banks per bank group. DDR4 can allow for a short core cycle delay time, tCCD_S (which is 4 cycles), for accesses to different bank groups, and a long core cycle delay time, tCCD_L (which is more than 4 cycles), for accesses to banks within the same bank group. tCCD_S can be set equal to one half the burst length (BL/2) to allow streaming data at full bandwidth for reads and writes. Thus, a burst length of 8 corresponds to a tCCD_S of 4 cycles.

Memory 120 includes access logic 122 to receive and decode commands from memory controller 110. In one embodiment, access logic 122 is part of a controller or control logic on the memory device that manages the operations of the memory. Such a controller refers to an on-memory controller that controls the internal timing and sequencing of operations to execute the command received from memory controller 110. The internal controller generates internal operations to execute the commands received. Memory 120 includes I/O 124 to interface with memory controller 110. I/O 124 can be similar or the same as I/O 114 of memory controller, and can likewise represent any type of hardware to exchange signals between the two devices.

In one embodiment, access logic 122 includes decode logic 150. Decode logic 150 enables memory 120 to decode commands received from memory controller 110, to determine what type of access to make to what memory resources 130 of the memory. Decode logic 150 enables memory 120 to route command signals to memory resources 130 identified in the command. In one embodiment, access logic 122 includes refresh logic 152 internal to memory 120. In one embodiment, access logic 122 includes precharge logic 154 internal to memory 120.

In one embodiment, memory controller 110 can issue refresh commands (REF) and per bank refresh commands (REFpb). A REF command triggers memory 120 via refresh logic 152 to refresh the value stored in memory locations associated with address information in the REF command. A REFpb command operates similarly to a REF command, but specifically operates to refresh a bank. Thus, in a memory 120 with a bank group architecture, the memory controller can be enabled to control access by interleaving banks. Memory 120 can be configured to implement the command interleaved across the banks. The timing of access can be faster across banks than to the same bank, allowing the memory controller to more carefully control the access timing of issued commands.

With a per bank refresh command (REFpb), memory controller 110 can direct a refresh at a specific bank. For example, in refresh management for DDR4E devices, the distinction between a refresh command (REF) and a refresh per bank command (REFpb) is made using address bit A12. A refresh command with bit A12=1 indicates to refresh all banks, and with A12=0 indicates to refresh specified bank(s). Thus, memory controller 110 could generate and send a refresh command to refresh all banks (REF) and/or a specific bank (REFpb). For example, in the refresh command, the value on bank address bits BA2, BA1, BA0 specifies which bank to be refreshed. In one embodiment, the bank identified by bank address bits BA2, BA1, BA0 is a bank to be refreshed in all bank groups when a REFpb command is issued. Thus, in one embodiment, a refresh per bank command identifies a bank to be refreshed, and memory device 120 will refresh the identified bank across all bank groups 132 (e.g., for BA[2:0]=000, bank '000' will be refreshed in BankGroup0, BankGroup1, and so forth).

In one embodiment, memory controller 110 can issue a precharge command similarly defined to precharge the same bank in all bank groups. For example, a system can define up to three different types of precharge command. In one embodiment, a precharge command (PRE) with bit A10=0 or L (low) and A12=1 or H (high) can imply to precharge a single bank as indicated by a bank group and bank as specified by BG1, BG0 and BA2, BA1, BA0. In one embodiment, a precharge command (PREpb) with A10=0 and A12=0 can imply to precharge per bank, to precharge the same bank as specified by BA2, BA1 and BA0 in all bank groups. In one embodiment, a precharge command (PREA) with A10=1 can imply to precharge all banks. Memory 120, via precharge logic 154 can implement precharge commands received from memory controller 110. Thus, a PREA command can set all banks to an idle state, a PRE command can set a specific bank in a specific bank group to an idle state, and a PREpb command can set a specified bank to an idle state across all bank groups. In one embodiment, the bank identified by address bits BA[2:0] is a bank to be precharged in all bank groups when a PREpb is issued. In one embodiment, memory controller 110 issues a corresponding precharge command with a refresh command (e.g., a PREA with a REF, and a PREpb with a REFpb).

Traditionally, each REFpb command increments an internal bank counter. The memory controller can compare the internal bank counter to a threshold representing the number of available banks in a bank group 132. In one embodiment, upon detecting that the internal bank counter equals the number of available banks in a bank group 132, memory controller 110 can reset the counter to start over on the next or subsequent REFpb command. Each time the internal bank counter resets and starts over on the next REFpb command, memory controller 110 also increments a global refresh counter.

In one embodiment, memory controller 110 can issue a REFpb command to any bank 134 in any bank order, as long as every bank 134 has one REFpb command issued to it before any bank may be issued a subsequent REFpb command. In one embodiment, memory controller 110 issues a corresponding PRE command with each REFpb command, and thus can send precharge and refresh commands in the same bank order. The bank order refers to a sequence of refreshes. A round robin order may refresh in order of bank address, such as from highest to lowest or lowest to highest. The memory controller can interleave the refreshes and or precharge to access the banks out of order relative to the bank addresses. Memory controller 110 can manage the bank order, and thus prevent issuing a subsequent REFpb command issued to the same bank prior to every bank receiving a REFpb command. The memory controller can similarly manage PRE commands.

In one embodiment, issuing a REFpb command to the same bank multiple times before issuing a REFpb to all banks in the bank group is not permitted. In one embodiment, the first REFpb command issued is a "Synchronization" REFpb command, and the "Synchronization" count resets the internal bank counter to zero when any of the following occurs: (a) every bank has received one REFpb command; (b) the memory controller applies a RESET; (c) the memory device enters or exits a self refresh mode; or, (d) the memory controller issues a REF command to refresh all banks (i.e., a general refresh command instead of a REFpb command).

In one embodiment, memory controller 110 includes counter logic 116. Counter logic 116 can represent one or more counters internal to memory controller 110. The counters can be used to manage the issuing of commands, such as refresh commands. Memory controller 110 can use one or more counters 116 to manage refreshes of rows in memory 120. With each refresh, memory controller 110 can increment a counter 116 to keep track of what rows have been refreshed. In one embodiment, counter 116 can include bank counters and a global counter.

In one embodiment, memory 120 includes counter 126, which represents one or more counters within the memory device. In one embodiment, memory 120 uses counter 126 to keep track of row refreshes. In one embodiment, counter 116 can include bank counters and a global counter. In one embodiment, system 100 includes either counter 116 or counter 126, but not both. Memory 120 can manage counter 126 with internal control logic (an internal controller) in response to refresh commands received from memory controller 110.

In one embodiment, counter 126 represents a global refresh counter within memory 120. In one embodiment, global refresh counter 126 can be incremented when either the memory controller issues a REF command to refresh all banks, or when all banks have received a REFpb command and the "Synchronization" count is reset to zero. A REF command issued when the bank counter is not zero will increment the memory device's global refresh counter. In one embodiment, the REFpb command cannot be issued to the memory device until the following conditions are met:

tRFC (refresh cycle time) has been satisfied after the prior REF command;

tRFCpb (per bank refresh cycle time) has been satisfied after the prior REFpb command;

tRP (precharge cycle time) has been satisfied after a prior PRECHARGE command to an identified bank; and, tRRD_L has been satisfied after a prior ACTIVATE command (e.g., tRRD_L has to be met from ACTIVATE, seeing that REFpb will target a bank in all bank groups).

It will be understood that the target bank or the bank identified in the command is inaccessible during the per bank refresh cycle time (tRFCpb). Thus, a REFpb command will prevent access to an identified bank for tRFCpb while the bank performs the refresh operations. However, in one embodiment, other banks within memory 120 are accessible, and can be addressed during the refresh cycle (tRFCpb of the target bank). When the per bank refresh cycle has completed, the affected bank will be in idle state.

In one embodiment, after issuing a REFpb command, the following conditions must be met:

tRFCpb must be satisfied before issuing a REF command;

tRFCpb must be satisfied before issuing an ACTIVATE (ACT) command to the same bank; and, tRRD_L must be satisfied before issuing an ACT command or REFpb command to a different bank.

When memory 120 applies a refresh across banks 134 in all bank groups 132, it will be understood that memory controller 110 can schedule and issue fewer refresh commands. For example, in a system with 8 banks, a single REF command can be replaced with 8 REFpb commands. Replacing the single REF command with multiple REFpb commands can provide increased control over scheduling, both to selective postpone as well as selectively increasing refresh command activity. In one embodiment, REFpb command can be issued in a burst. A burst of REFpb can be set with a limitation determined with 8*{tRFCpb+(n−1)*tRRD_L} where n is equal to the number of banks in a bank group, tRFCpb is the per bank refresh cycle time, and tRRD_L is a long row to row delay or a delay time between Activate commands to the same bank group.

Thus, each memory device includes multiple banks in a bank group architecture. In the bank group architecture, a memory controller can address a specific bank with a bank group identifier and a bank identifier, with the bank group identifier specifying the bank group, and a bank address specifying the bank within the bank group. Each bank group has multiple banks similarly addressed. For example, BG0 can have banks B0-B3, and BG1 can have banks B0-B3, which are separately addressable by the combination of bank group and bank address information. The memory device and memory controller can be coupled via I/O hardware. In one embodiment, a memory controller is configured to determine to send a command for execution on a portion of the memory, and specifically, for an identified bank. The memory controller sends or issues a command, which the memory device receives and decodes. The command can be, for example, a precharge command or a refresh command, and identify a bank. Identifying a bank group can be optional or not defined, depending on the implementation. The memory device, in response to the command, can be configured to execute the command for all banks having the bank identifier, including banks in different bank groups.

FIG. 2 is a representation of an embodiment of a command table for per bank and all bank refresh commands and per bank and all bank precharge commands. Command table 210 provides one example of an embodiment of commands for use in a DDR4E or DDR5 system. A memory controller generates the commands listed to generate the desired operation. The memory controller sends the commands to one or more connected memory devices (either directly connected or connected in a memory module) to trigger the memory device(s) to execute the commands.

It will be understood that table 210 illustrates only Refresh and Precharge commands, but typically all memory access commands are defined in a similar manner, illustrating L for logic low outputs (e.g., a '0'), H for logic high outputs (e.g., a '1'), and V for Don't Cares. Table 210 also illustrates values "BG" and "BA," which refer, respectively, to bank group address and bank address. It will be understood that depending on how many banks and bank groups are supported in a specific memory system implementation, the number of bits to specify the addresses can be different. As illustrated, a system implementing command in accordance with Table 210 supports up to eight bank groups, and up to four banks per bank group. In another implementation, for a system having devices with 4 bank groups and 8 banks, Table 210 can have BG0-BG1 and BA0-BA2. Other configurations are possible.

Command 212 illustrates a Refresh all banks command, with bit A12 set high. Because all banks are refreshed, the bank group and bank address bits are "Don't Cares." In response to such a command, the memory device will refresh all banks. Command 214 illustrates a Refresh per bank, with bit A12 set low. In response to such a command, the memory device will refresh the bank at the bank group (BG) and bank address (BA) indicated. In one embodiment, the bank group address is a Don't Care, and the memory device will refresh the bank identified by BA[1:0] in all bank groups.

Command 220 illustrates a Precharge all (PREA) command, with bit A10 set high. Because all banks are precharged, the bank group and bank address bits are "Don't Cares." In response to such a command, the memory device will precharge all banks. Command 216 illustrates a Precharge per bank (PREpb) command, with bit A10 set low and bit A12 set low. In response to such a command, the memory device will precharge the bank at the bank address (BA) indicated across all banks. In one embodiment, the bank group address is a Don't Care, and the memory device will precharge the bank identified by BA[1:0] in all bank groups. Command 218 illustrates a Precharge single bank (PRE) command, with bit A10 set low and bit A12 set high. In response to such a command, the memory device will precharge the specific bank identified at BG[2:0] and BA[1:0].

The implementation of the per bank commands can be different based on different system definitions. In one embodiment, the memory controller provides a command with a bank identifier that sets a specific bit (e.g., one of the unused or "Don't Care" bits) indicating that the per bank refresh command is to be applied to the identified bank in all bank groups. For example, consider that bit A10 could be used to identify whether the per bank refresh is to apply to all bank groups, or only a specified bank group. As another example, consider that bit A12 could be used to identify whether the per bank precharge is to apply to all bank groups, or only a specified bank group. Other implementations are possible. In one embodiment, a memory device is configured to apply a REFpb and/or a PREpb across all bank groups. For example, consider that bits A10 and A12 could apply to a refresh and/or a precharge to a specified bank or across all bank groups. Thus, the memory controller can be configured to not drive the bank group identifier, effectively sending a command not having a bank group identifier. In one embodiment, the bank group identifier bits can be defined with a predefined code to allow the indication of all bank groups via the bank group bits, in addition to being able to identify a specific bank group. Alternatively, one of the other unused bits can be used as an all bank group identifier.

Bank group architecture requires a larger tCCD (CAS to CAS delay time) or time for sequential CAS (column address strobe) commands, or from CAS to CAS, whether or read or write, if the commands are targeted to the same bank group. In one embodiment, tCCD across bank groups can be set equal to the burst length (BL) so sequential data can be streamed seamlessly across bank groups. In one embodiment, the memory controller maps sequential addresses across bank groups. Thus, when access commands are made to sequential addresses, the accesses occur across bank groups and allow for the use of the tCCD_S, which is lower than tCCD_L, which is a longer delay between accessing banks in the same bank group.

Access across bank groups ties up different bank resources from the perspective of the memory controller. Thus, refreshing the same bank across bank groups essentially ties up a single resource for a time tRFCpb from the perspective of the memory controller. Such refreshing across different bank groups can reduce command bandwidth issues on servers that have multiple DIMMs (dual inline memory modules) and ranks. By issuing a refresh command from the memory controller which the memory devices execute on banks across different bank groups, the memory controller can issue fewer refresh commands in certain conditions. For example, in one embodiment, the memory controller can issue 8 refresh commands where it would have issued 32 instead, referring to issuing 8 per bank refreshes that are applied across 4 bank groups, instead of issuing 32 per bank refreshes to refresh the 8 banks each in each bank group separately.

Figure 3:
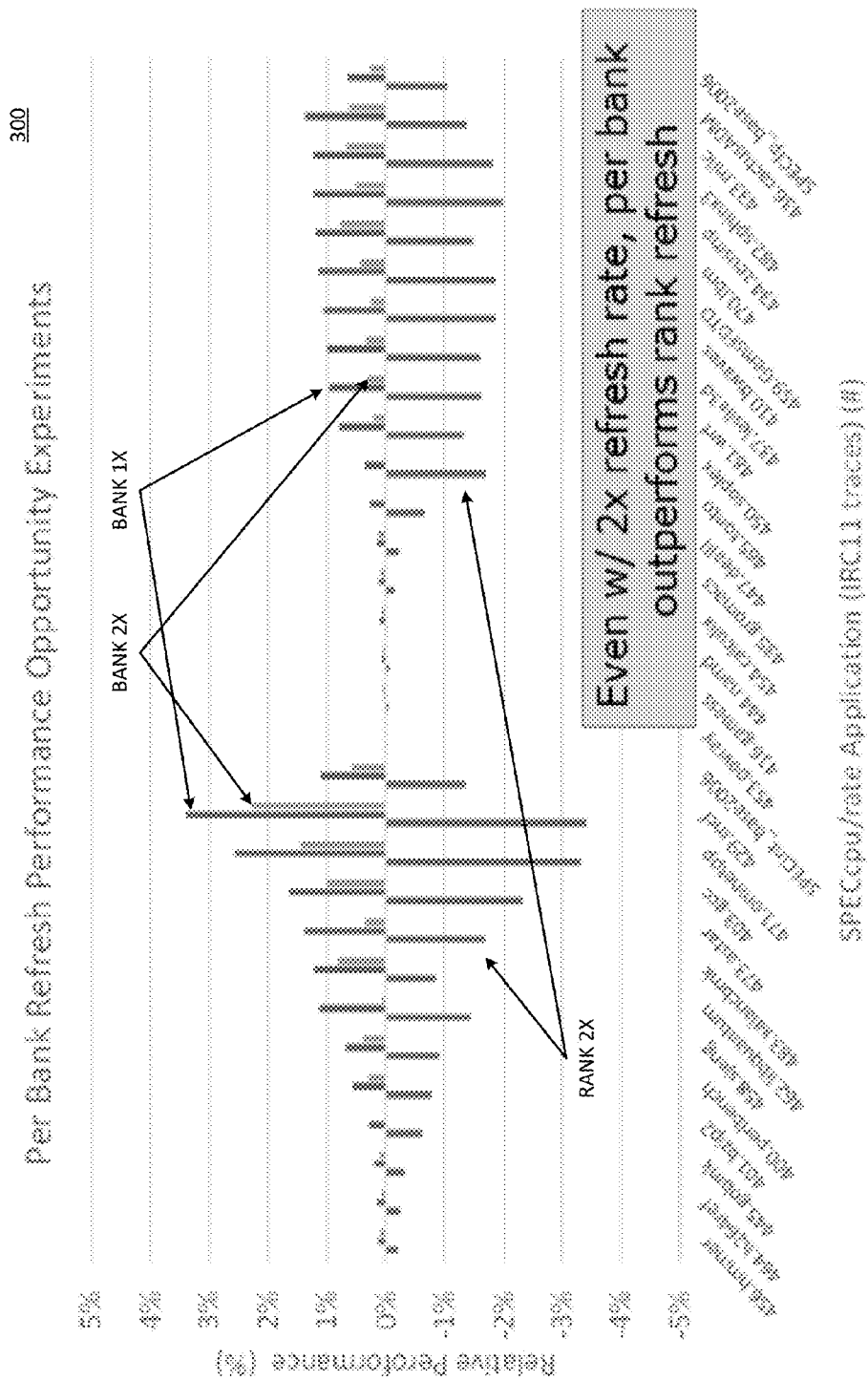
FIG. 3 is a diagrammatic representation of an embodiment of system performance for a system that implements bank refresh across bank groups.

FIG. 3 is a diagrammatic representation of an embodiment of system performance for a system that implements bank refresh across bank groups. Diagram 300 illustrates performance improvements exhibited by testing the operation of refreshing the same bank across all bank groups in response to a per bank refresh command. In diagram 300, relative performance illustrates a percentage of performance difference with respect to a baseline. The labels on the horizontal axis of diagram 300 indicate the tests or applications on which performance was measured. It will be understood that the per bank refresh performance illustrated in diagram 300 includes use of commands to precharge and then refresh the same bank number across bank groups.

In the example of diagram 300, the baseline is a 1× rank refresh. The 1× refers to a 7.8 us tREFI refresh rate for 4 Gb device using a tRFC of 260 ns. The rank refresh refers to performing refreshes on the rank level. The bars into negative percentages are labeled as Rank 2×, and represent the loss in performance with a 2× refresh rate of 3.9 us. Thus, the bars below the baseline assume the standard rank refreshing, but with double the refresh rate. There are two bars for each test that extend into positive percentages. Both bars represent performance gains due to per bank refresh where refreshes are performed across bank groups. The bars on the left represent per bank refreshes with 7.8 us tREFI. The bars on the right represent gain in performance using per bank refresh with 3.9 us tREFI. Diagram 300 illustrates the loss in rank refreshing performance due to doubling the refresh rate, and that the loss in performance is more than compensated with per bank refresh even if the refresh rate is doubled.

Figure 4:
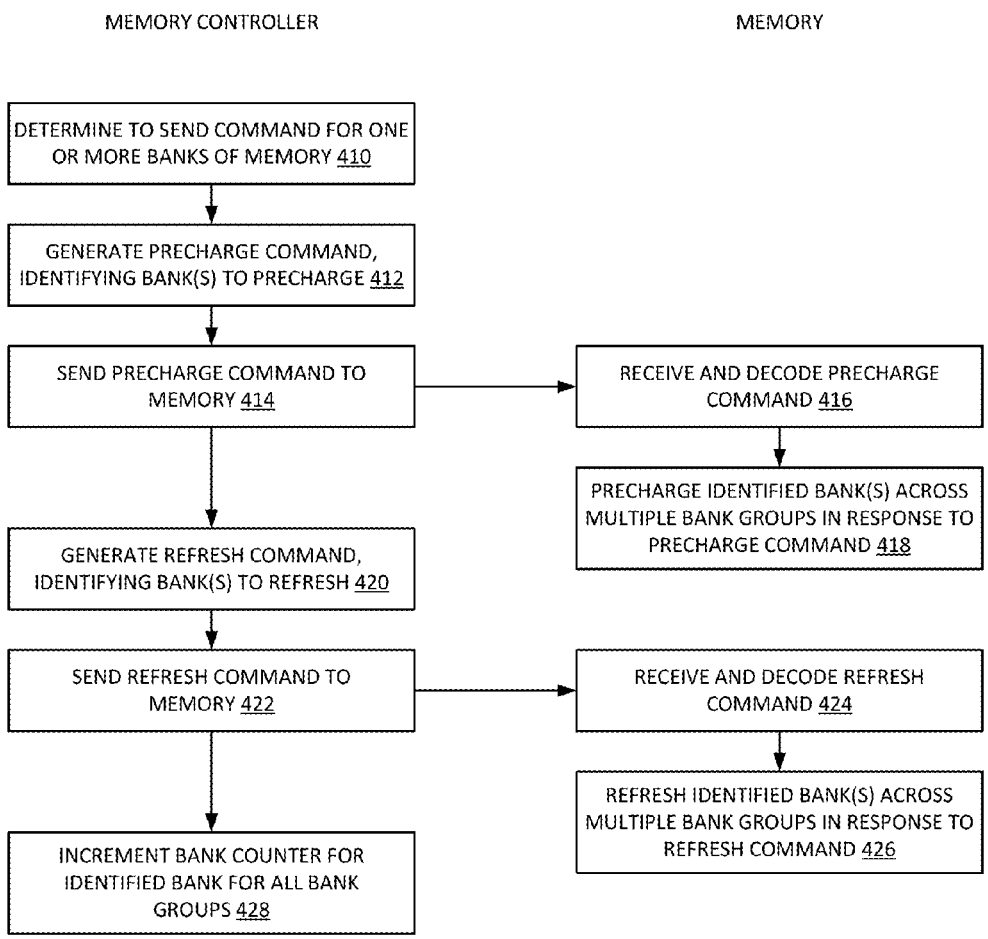
FIG. 4 is a flow diagram of an embodiment of a process for performing refresh.

FIG. 4 is a flow diagram of an embodiment of a process for performing refresh. In one embodiment, a memory controller determines to refresh one or more banks of an associated memory device, 410. In one embodiment, multiple memory devices (e.g., DRAMs or SDRAMs) are coupled to the same memory controller, and each can implement the same commands in parallel in the bank group and bank resources individual to the memory device. In one embodiment, the memory controller is configured with information indicating that the memory has a bank group architecture. In such an implementation, in one embodiment, the memory controller can determine to send a command for execution on a only an identified portion a memory device. For example, the memory controller can determine to access only a specific bank of the memory, instead of accessing all banks. Such operation can be supported by all bank and per bank command mechanisms in accordance with any embodiment described herein.

In one embodiment, the memory controller generates a precharge command identifying a bank or banks to precharge, 412. In one embodiment, the precharge command is to apply to the identified bank(s) across all bank groups in the memory. The memory controller can send the precharge command to the memory, 414. In one embodiment, the memory receives and decodes the precharge command, 416. In one embodiment, the memory precharges the identified bank(s) across all bank groups in response to the precharge command, 418. The sending of the command can be in accordance with any embodiment described herein, which can identify the precharge command as applying to all bank groups instead of a single bank group.

In one embodiment, the memory controller generates a refresh command identifying the bank(s) to refresh, 420. Similar to what is stated above regarding the precharge command, the generation and sending of the command can be in accordance with any embodiment described herein. Thus, the memory controller can employ a mechanism to indicate that a command is to be applied across all bank groups or a single bank group. Alternatively, the memory devices can be configured to respond to all per bank commands as applying to the identified bank in all bank groups, instead of in a specific bank group. The memory controller can send the refresh command to the memory, 422. In one embodiment, the memory receives and decodes the refresh command, 424. The memory can refresh the identified bank(s) across all bank groups in response to the refresh command, 426.

In one embodiment, the memory controller increments a bank counter for the identified bank for all bank groups, 428. In one embodiment, the memory controller keeps different bank counters for different bank groups, and can update all bank counters when issuing a refresh command that applies across bank groups. In one embodiment where the memory subsystem applies refreshes of the same bank across bank groups, the memory controller keeps only a single per bank refresh counter, and updates it in conjunction with issuing per bank refreshes that apply across bank groups. It will be understood that applying a refresh command that covers the same bank number across all bank groups can provide good performance as accesses are interleaved across bank groups to the same corresponding banks.

Figure 5:
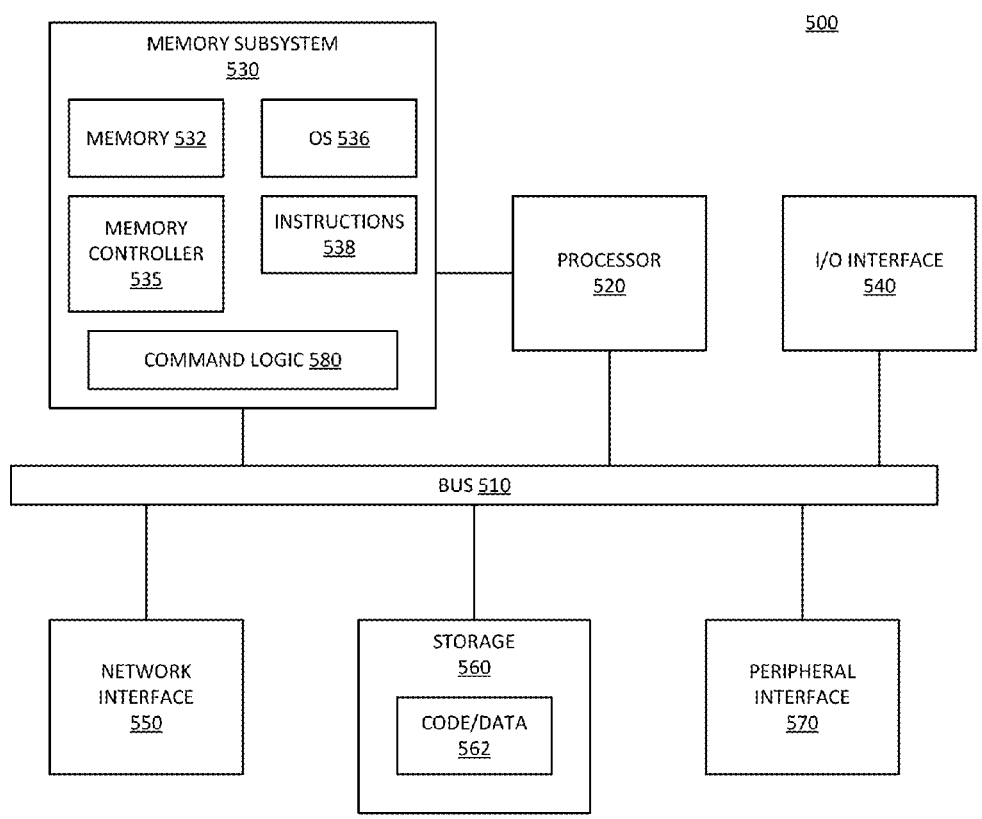
FIG. 5 is a block diagram of an embodiment of a computing system in which refresh of a specified bank across bank groups can be implemented.

FIG. 5 is a block diagram of an embodiment of a computing system in which refresh of a specified bank across bank groups can be implemented. System 500 represents a computing device in accordance with any embodiment described herein, and can be a laptop computer, a desktop computer, a server, a gaming or entertainment control system, a scanner, copier, printer, routing or switching device, or other electronic device. System 500 includes processor 520, which provides processing, operation management, and execution of instructions for system 500.

Processor 520 can include any type of microprocessor, central processing unit (CPU), processing core, or other processing hardware to provide processing for system 500. Processor 520 controls the overall operation of system 500, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 can include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520. Memory subsystem 530 includes memory device 532 where it stores data, instructions, programs, or other items. In one embodiment, memory subsystem includes memory controller 534, which is a memory controller to generate and issue commands to memory device 532. It will be understood that memory controller 534 could be a physical part of processor 520.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 can also correspond to interfaces in network interface 550.

System 500 also includes one or more input/output (I/O) interface(s) 540, network interface 550, one or more internal mass storage device(s) 560, and peripheral interface 570 coupled to bus 510. I/O interface 540 can include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 can include an Ethernet adapter, wireless interconnection components, USB (universal serial bus), or other wired or wireless standards-based or proprietary interfaces.

Storage 560 can be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 can be generically considered to be a "memory," although memory 530 is the executing or operating memory to provide instructions to processor 520. Whereas storage 560 is nonvolatile, memory 530 can include volatile memory (i.e., the value or state of the data is indeterminate if power is interrupted to system 500).

Peripheral interface 570 can include any hardware interface not specifically mentioned above. Peripherals refer generally to devices that connect dependently to system 500. A dependent connection is one where system 500 provides the software and/or hardware platform on which operation executes, and with which a user interacts.

In one embodiment, memory subsystem 530 includes command logic 580, which can represent logic of memory 532 and/or logic of memory controller 534. Command logic 580 allows the memory subsystem to apply per bank commands across bank groups to the same identified bank. For example, the per bank commands can include per bank precharge and/or per bank refresh commands. In one embodiment, a per bank refresh command can identify a bank number, and the same bank can be refreshed across all bank groups by the memory device. Similarly, in one embodiment, a per bank precharge command can identify a bank number, and the same bank can be precharged across all bank groups by the memory device.

Figure 6:
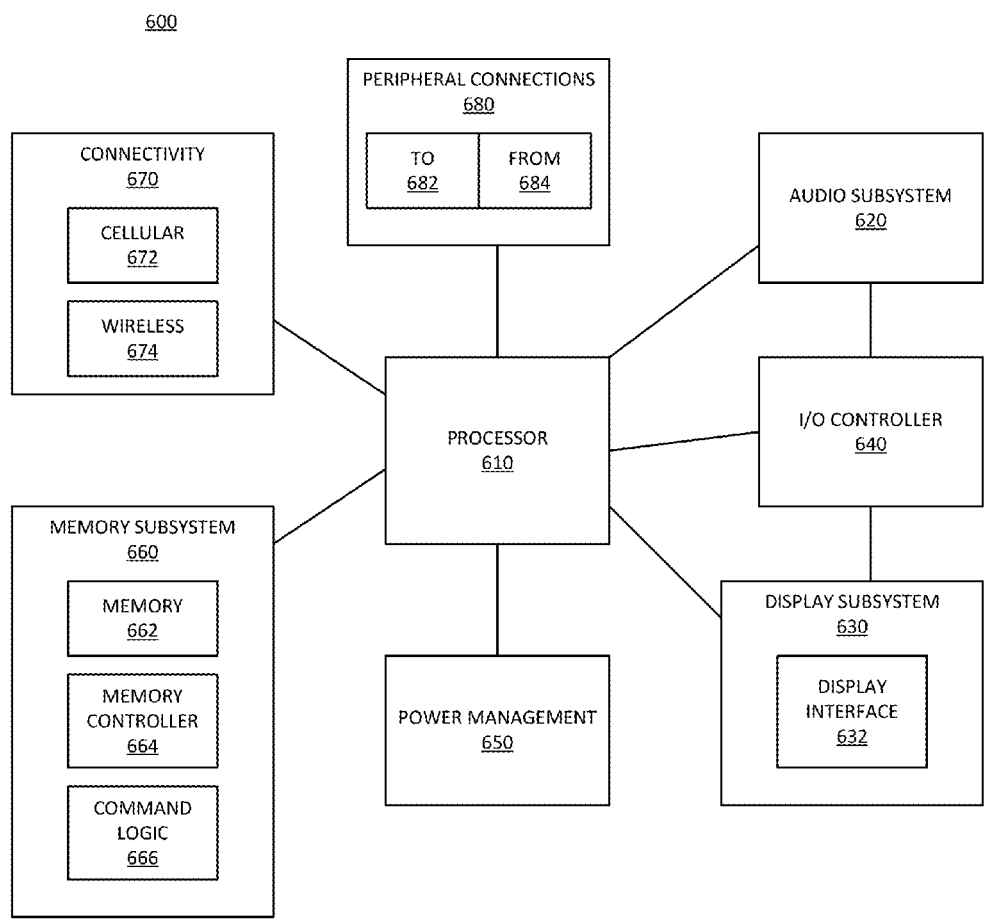
FIG. 6 is a block diagram of an embodiment of a mobile device in which refresh of a specified bank across bank groups can be implemented.

FIG. 6 is a block diagram of an embodiment of a mobile device in which refresh of a specified bank across bank groups can be implemented. Device 600 represents a mobile computing device, such as a computing tablet, a mobile phone or smartphone, a wireless-enabled e-reader, wearable computing device, or other mobile device. It will be understood that certain of the components are shown generally, and not all components of such a device are shown in device 600.

Device 600 includes processor 610, which performs the primary processing operations of device 600. Processor 610 can include one or more physical devices, such as microprocessors, application processors, microcontrollers, programmable logic devices, or other processing means. The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations can also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 includes display interface 632, which includes the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user. In one embodiment, display subsystem 630 includes a high definition (HD) display that provides an output to a user. High definition can refer to a display having a pixel density of approximately 100 PPI (pixels per inch) or greater, and can include formats such as full HD (e.g., 1080 p), retina displays, 4K (ultra high definition or UHD), or others.

I/O controller 640 represents hardware devices and software components related to interaction with a user. I/O controller 640 can operate to manage hardware that is part of audio subsystem 620 and/or display subsystem 630. Additionally, I/O controller 640 illustrates a connection point for additional devices that connect to device 600 through which a user might interact with the system. For example, devices that can be attached to device 600 might include microphone devices, speaker or stereo systems, video systems or other display device, keyboard or keypad devices, or other I/O devices for use with specific applications such as card readers or other devices.

As mentioned above, I/O controller 640 can interact with audio subsystem 620 and/or display subsystem 630. For example, input through a microphone or other audio device can provide input or commands for one or more applications or functions of device 600. Additionally, audio output can be provided instead of or in addition to display output. In another example, if display subsystem includes a touchscreen, the display device also acts as an input device, which can be at least partially managed by I/O controller 640. There can also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that can be included in device 600. The input can be part of direct user interaction, as well as providing environmental input to the system to influence its operations (such as filtering for noise, adjusting displays for brightness detection, applying a flash for a camera, or other features). In one embodiment, device 600 includes power management 650 that manages battery power usage, charging of the battery, and features related to power saving operation.

Memory subsystem 660 includes memory device(s) 662 for storing information in device 600. Memory subsystem 660 can include nonvolatile (state does not change if power to the memory device is interrupted) and/or volatile (state is indeterminate if power to the memory device is interrupted) memory devices. Memory 660 can store application data, user data, music, photos, documents, or other data, as well as system data (whether long-term or temporary) related to the execution of the applications and functions of system 600. In one embodiment, memory subsystem 660 includes memory controller 664 (which could also be considered part of the control of system 600, and could potentially be considered part of processor 610). Memory controller 664 includes a scheduler to generate and issue commands to memory device 662.

Connectivity 670 includes hardware devices (e.g., wireless and/or wired connectors and communication hardware) and software components (e.g., drivers, protocol stacks) to enable device 600 to communicate with external devices. The external device could be separate devices, such as other computing devices, wireless access points or base stations, as well as peripherals such as headsets, printers, or other devices.

Connectivity 670 can include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector can allow device 600 to connect to certain peripherals that allow device 600 to control content output, for example, to audiovisual or other systems.

In addition to a proprietary docking connector or other proprietary connection hardware, device 600 can make peripheral connections 680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, memory subsystem 660 includes command logic 666, which can represent logic of memory 662 and/or logic of memory controller 664. Command logic 666 allows the memory subsystem to apply per bank commands across bank groups to the same identified bank. For example, the per bank commands can include per bank precharge and/or per bank refresh commands. In one embodiment, a per bank refresh command can identify a bank number, and the same bank can be refreshed across all bank groups by the memory device. Similarly, in one embodiment, a per bank precharge command can identify a bank number, and the same bank can be precharged across all bank groups by the memory device.

In one aspect, a memory device for refreshing in a memory subsystem includes: multiple banks of memory in a bank group architecture where banks of memory resources are separately addressable in bank groups by bank group identifier and bank identifier; I/O (input/output) hardware to couple to a memory controller and receive a command from the memory controller, the command including a bank identifier; and logic to decode the command and access banks corresponding to the bank identifier, including banks in different bank groups, based at least in part on the command.

In one embodiment, the I/O hardware is configured to receive the command having a bank identifier for more than one bank. In one embodiment, the I/O hardware is configured to receive the command not having a bank group identifier. In one embodiment, the I/O hardware is configured to receive the command having a bank group identifier to select all bank groups. In one embodiment, the command comprises a refresh command. In one embodiment, the command comprises a precharge command. In one embodiment, the command comprises a sequence of a precharge command and a refresh command to access the same bank identifier in different bank groups. In one embodiment, further comprising a memory controller coupled to the memory device. In one embodiment, further comprising at least one processor and a network interface, the at least one processor communicatively coupled to the memory controller and the network interface communicatively coupled to the at least one processor.

In one aspect, a system for performing refresh includes: a memory controller; and a memory device coupled with the memory controller, the memory device including multiple banks of memory in a bank group architecture where banks of memory resources are separately addressable in bank groups by bank group identifier and bank identifier; I/O (input/output) hardware to couple to a memory controller and receive a command from the memory controller, the command including a bank identifier; and logic to decode the command and access banks corresponding to the bank identifier, including banks in different bank groups, based at least in part on the command.

In one aspect of the system, the memory device is in accordance with any embodiment of the aspect of the memory device above. In one embodiment, further comprising at least one processor communicatively coupled to the memory controller. In one embodiment, the memory controller is part of the processor. In one embodiment, further comprising a network interface communicatively coupled to the at least one processor.

In one aspect, a method for refresh in a memory subsystem includes: receiving a command at a memory device from a memory controller, the command including a bank identifier, the memory device having a bank group architecture where banks of memory resources are separately addressable in bank groups by bank group identifier and bank identifier; and in response to receiving the command, causing all banks corresponding to the bank identifier to execute the command, including banks in different bank groups.

In one aspect of the method, the method is to include operations in accordance with any embodiment set forth above with respect to the memory device. In one aspect, an article of manufacture comprising a computer readable storage medium having content stored thereon, which when accessed causes the performance of operations to execute a method for refreshing in accordance with any embodiment of the method. In one aspect, an apparatus for refreshing comprising means for performing operations to execute a method in accordance with any embodiment of the method.

In one aspect, a memory controller includes: command logic to determine to send a command for execution on a portion of an associated memory device to access only an identified portion of the memory device, the memory device having a bank group architecture where banks of memory resources are separately addressable in bank groups by bank group identifier and bank identifier; and I/O (input/output) hardware to couple to the memory device, the I/O hardware to generate and send the command to the memory device, the command including a bank identifier, the command to access all banks corresponding to the bank identifier within the memory device for execution of the command, including banks in different bank groups.

In one embodiment, the I/O hardware to send the command comprises the I/O hardware configured to send the command with a bank identifier for more than one bank. In one embodiment, the I/O hardware to send the command comprises the I/O hardware configured to send the command without a bank group identifier. In one embodiment, the I/O hardware to send the command comprises the I/O hardware configured to send the command with a bank group identifier to select all bank groups. In one embodiment, the I/O hardware to send the command comprises the I/O hardware configured to send a precharge command, a refresh command, or both in sequence to access the same bank identifier in different bank groups.

In one aspect, a second system for performing refresh includes: a memory device; and a memory controller coupled to the memory device, the memory controller including command logic to determine to send a command for execution on a portion of an associated memory device to access only an identified portion of the memory device, the memory device having a bank group architecture where banks of memory resources are separately addressable in bank groups by bank group identifier and bank identifier; and I/O (input/output) hardware to couple to the memory device, the I/O hardware to generate and send the command to the memory device, the command including a bank identifier, the command to access all banks corresponding to the bank identifier within the memory device for execution of the command, including banks in different bank groups.

In one aspect of the second system, the memory device is in accordance with any embodiment of the aspect of the memory controller above. In one embodiment, further comprising at least one processor communicatively coupled to the memory controller. In one embodiment, the memory controller is part of the processor. In one embodiment, further comprising a network interface communicatively coupled to the at least one processor.

In one aspect, a second method for refresh in a memory subsystem includes: determining to send a command for execution on a portion of an associated memory device to access only an identified portion of the memory device, the memory device having a bank group architecture where banks of memory resources are separately addressable in bank groups by bank group identifier and bank identifier; and sending the command to the memory device, the command including a bank identifier, the command to access all banks corresponding to the bank identifier within the memory device for execution of the command, including banks in different bank groups.

In one aspect of the second method, the second method is to include operations in accordance with any embodiment set forth above with respect to the memory controller. In one aspect, an article of manufacture comprising a computer readable storage medium having content stored thereon, which when accessed causes the performance of operations to execute a method for refreshing in accordance with any embodiment of the second method. In one aspect, an apparatus for refreshing comprising means for performing operations to execute a method in accordance with any embodiment of the second method.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware and/or software. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, and/or data. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters and/or sending signals to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A memory device comprising:
   multiple banks of memory in a bank group architecture where banks of memory resources are separately addressable in bank groups by bank group identifier and bank identifier;
   I/O (input/output) hardware to couple to a memory controller and receive a command from the memory controller, the command including a bank identifier; and
   logic to decode the command and access banks corresponding to the bank identifier in response to the command, including banks identified by the bank identifier in multiple different bank groups.

2. The memory device of claim 1, wherein the I/O hardware is configured to receive the command having a bank identifier for more than one bank.

3. The memory device of claim 1, wherein the I/O hardware is configured to receive the command not having a bank group identifier.

4. The memory device of claim 1, wherein the I/O hardware is configured to receive the command having a bank group identifier to select all bank groups.

5. The memory device of claim 1, wherein the command comprises a refresh command.

6. The memory device of claim 1, wherein the command comprises a precharge command.

7. The memory device of claim 1, wherein the command comprises a sequence of a precharge command and a refresh command to access the same bank identifier in different bank groups.

8. The memory device of claim 1, further comprising a memory controller coupled to the memory device.

9. The memory device of claim 8, further comprising at least one processor and a network interface, the at least one processor communicatively coupled to the memory controller and the network interface communicatively coupled to the at least one processor.

10. A method for refresh in a memory subsystem, comprising:
    receiving a command at a memory device from a memory controller, the command including a bank identifier, the memory device having a bank group architecture where banks of memory resources are separately addressable in bank groups by bank group identifier and bank identifier; and
    in response to receiving the command, causing banks corresponding to the bank identifier to execute the command, including banks identified by the bank identifier in multiple different bank groups.

11. The method of claim 10, wherein receiving the command comprises receiving a command including a bank identifier for more than one bank.

12. The method of claim 10, wherein receiving the command comprises receiving a command not including a bank group identifier.

13. The method of claim 10, wherein receiving the command comprises receiving a command including a bank group identifier to select all bank groups.

14. The method of claim 10, wherein the command comprises a refresh command.

15. The method of claim 10, wherein the command comprises a precharge command.

16. The method of claim 10, wherein receiving the command comprises receiving a sequence of a precharge command and a refresh command to access the same bank identifier in different bank groups.

17. A memory controller comprising:
    command logic to determine to send a command for execution on a portion of an associated memory device to access only an identified portion of the memory device, the memory device having a bank group architecture where banks of memory resources are separately addressable in bank groups by bank group identifier and bank identifier; and
    I/O (input/output) hardware to couple to the memory device, the I/O hardware to generate and send the command to the memory device, the command including a bank identifier, the command to access banks corresponding to the bank identifier within the memory device for execution of the command, including banks identified by the bank identifier in multiple different bank groups.

18. The memory controller of claim 17, wherein the I/O hardware to send the command comprises the I/O hardware configured to send the command with a bank identifier for more than one bank.

19. The memory controller of claim 17, wherein the I/O hardware to send the command comprises the I/O hardware configured to send the command without a bank group identifier.

20. The memory controller of claim 17, wherein the I/O hardware to send the command comprises the I/O hardware configured to send the command with a bank group identifier to select all bank groups.

21. The memory controller of claim 17, wherein the I/O hardware to send the command comprises the I/O hardware configured to send a precharge command, a refresh command, or both in sequence to access the same bank identifier in different bank groups.

22. A method for refresh in a memory subsystem, comprising:

determining to send a command for execution on a portion of an associated memory device to access only an identified portion of the memory device, the memory device having a bank group architecture where banks of memory resources are separately addressable in bank groups by bank group identifier and bank identifier; and sending the command to the memory device, the command including a bank identifier, the command to access banks corresponding to the bank identifier within the memory device for execution of the command, including banks identified by the bank identifier in multiple different bank groups.

23. The method of claim 22, wherein sending the command includes sending a bank identifier for more than one bank.

24. The method of claim 22, wherein sending the command includes sending the command without a bank group identifier.

25. The method of claim 22, wherein sending the command includes sending a bank group identifier to select all bank groups.

26. The method of claim 22, wherein sending the command comprises sending a precharge command, a refresh command, or both in sequence to access the same bank identifier in different bank groups.

* * * * *